United States Patent
Livshits

[19]
[11] Patent Number: 5,871,814
[45] Date of Patent: Feb. 16, 1999

[54] PNEUMATIC GRIP

[75] Inventor: David Livshits, Ashdad, Israel

[73] Assignee: Robotech, Inc., Brooklyn, N.Y.

[21] Appl. No.: 896,746

[22] Filed: Jul. 18, 1997

[51] Int. Cl.$^6$ ..................................................... B05D 3/00
[52] U.S. Cl. ........................... 427/294; 118/503; 269/21; 294/64.3; 901/40
[58] Field of Search ................... 118/503; 138/44, 138/45, 46; 269/21; 294/64.3; 427/294; 401/40

[56] References Cited

U.S. PATENT DOCUMENTS 5,066,058  11/1991  Guyard ................................. 294/64.3 X
5,169,196  12/1992  Safabakhsh .......................... 294/64.3
5,492,566  2/1996  Sumnitsch ............................. 118/500

*Primary Examiner*—Michael Lusignan
*Attorney, Agent, or Firm*—Kohn & Associates

[57] ABSTRACT

A device for shaping a vacuum includes a housing having a primary passageway which includes an inlet. A fluid shaping mechanism is disposed in the primary passageway in fluid communication with the inlet for changing the shape of a fluid flow into a planar fluid flow flowing radially outwardly from a central point. The fluid shaping mechanism includes a conically-shaped portion disposed within the primary passageway, a plurality of secondary passageways extending through the housing from a periphery of the cone-shaped surface to outlets at a bottom surface of the housing, and a reflector adjacent to and spaced from the bottom surface for uniformly reflecting the fluid from the secondary passageways radially outwardly to create a vacuum adjacent thereto.

28 Claims, 4 Drawing Sheets

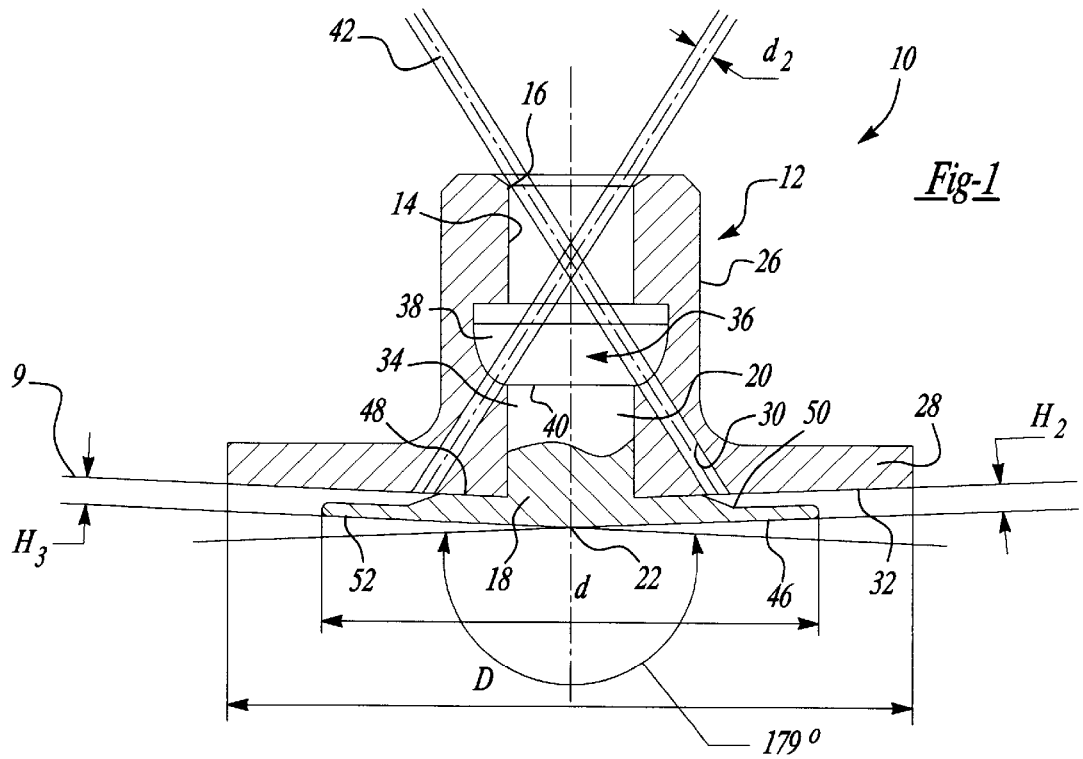
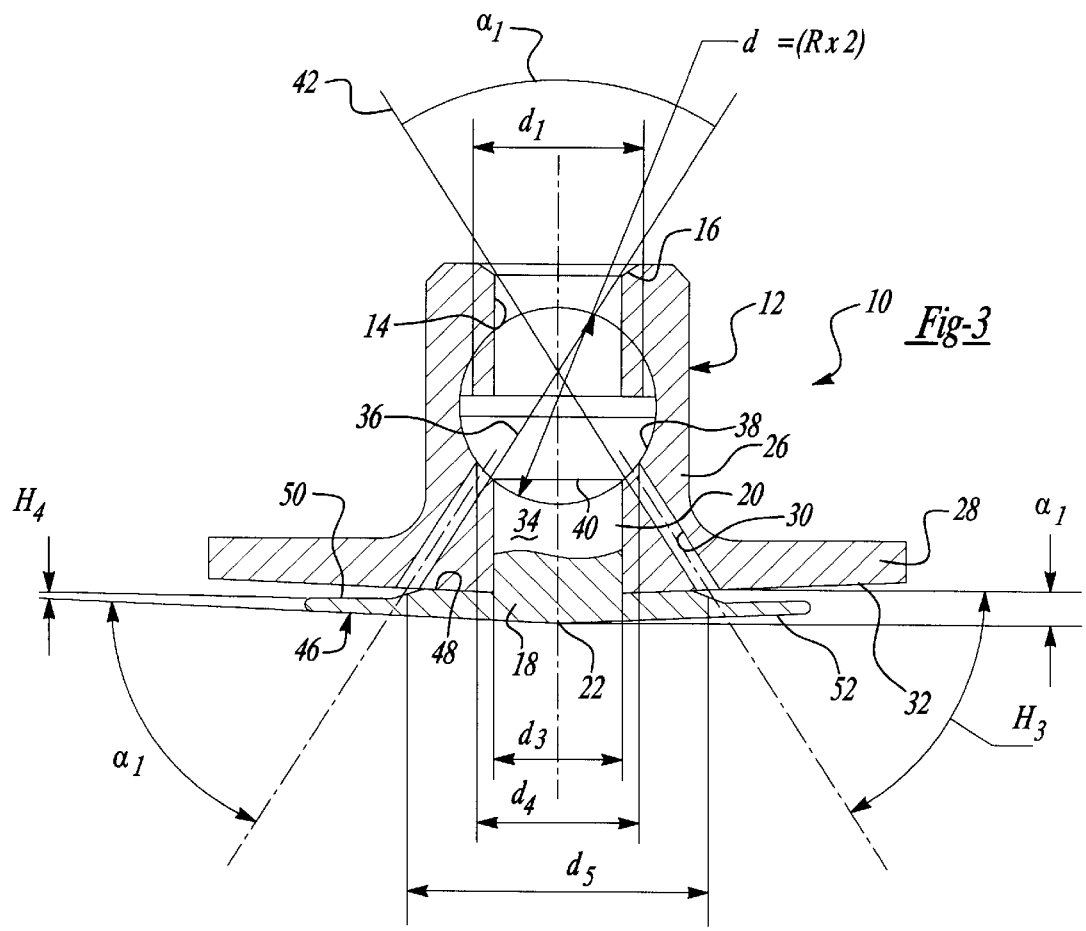

PNEUMATIC GRIP

TECHNICAL FIELD

The present invention relates to pick-up heads that are capable of picking up objects ranging in size to as small as semi-conductor chips or small diamonds to larger items. Most particularly, the present invention relates to gripping units of robots, manipulators, automatic production lines, and various technological complexes where it is necessary to create a locale vacuum for performing technological operations.

BACKGROUND OF THE INVENTION

Tools used for picking up parts, such as semi-conductor chips and the like, can be made from simple tubes attached to a vacuum source. However, such pick-up tools for use with delicate objects, such as semi-conductor devices, could damage the object being picked up. Pick-up heads have been developed for such operations.

The pick-up heads urge an article against a projection by a vacuum-produced base on the aereodynamic paradox (Bernoulli's principle) between a dish-shaped article and the surface of a support facing an article. Since a projection or several projections engage an article outside of its center, it can be securely retained, such as during a treatment operation or even set into rotation.

Such pick-up heads, which can also be termed "grippers", can be incorporated as gripping units of robots and manipulators or nippers for various technological processes. Gripping tables of micro- and mini-centrifuges in microelectronics can use such technology. Such grippers can also be used for gripping and carrying liquids to hard to reach localities, such as in the case of performing electrochemical and chemical operations in manufacturing printed circuit cards, precision etching with subsequent removal of the etching products from working areas, automation means in producing lacquer coatings, in the food industry, optics, and photolithograthic processes.

Examples of such pick-up heads or grippers are disclosed in U.S. Pat. No. 5,169,196 to Safabakhsh, issued Feb. 8, 1992, and 5,492,566 to Sumnitsch, issued Feb. 29, 1996. Each of these prior art references disclose a pick-up tool or pick-up head including a housing having a disk disposed therein. The disk changes a fluid flow from a cylindrical flow to a planar flow by directing the cylindrical flow over a conical-shaped insert. The insert has a flat working surface exposed to the article being gripped thereby. Such devises have contact-vacuum principle of operation. This hinders gripping parts with uneven surfaces, parts with holes, as well as those coated with various liquids and other consistent materials. Also, such a vacuum can distort brittle or thin parts.

In view of the above, it is desirable to provide a gripper unit which reduces to a minimum the contact between the surface gripped and the area of the vacuum formation, to increase accuracy when establishing a line of demarcation between local areas and vacuum creation, as well as to increase efficiency, uniformity, and vacuum depth with minimum power conception. It is also advantageous to use liquid media as a energy carrier.

SUMMARY OF THE INVENTION AND ADVANTAGES

In accordance with the present invention, there is provided a device for shaping a vacuum which includes a housing having a primary passageway, the primary passageway including an inlet. The fluid shaping means is disposed in the primary passageway in fluid communication with the inlet for changing the shape of the fluid flow into a planar fluid flow flowing radially outwardly from a central point. The fluid shaping means includes a conically shaped portion disposed within the passageway, a plurality of secondary passageways extending through the housing from a periphery of the cone shaped surface to outlets at a bottom surface of the housing, and reflector means adjacent to and spaced from the bottom surface for uniformly reflecting the fluid from the secondary passageways radially outwardly to create a vacuum adjacent thereto.

The present invention further provides a method of creating a local vacuum by changing the shape of a fluid flow by supplying a fluid flow into an inlet of a housing and shaping the fluid flow into a conical fluid flow over a cone shaped portion. The conical fluid flow is collected into a plurality of passageways and distributed from the passageways and over a reflector which forms a radially outwardly planar fluid flow.

BRIEF DESCRIPTION OF THE DRAWINGS

Other advantages of the present invention will be readily appreciated as the same becomes better understood by reference to the following detailed description when considered in connection with the accompanying drawings wherein:

FIG. 1 is a cross-sectional view of the device made in accordance with the present invention;

FIG. 3 is a cross-sectional view of the present invention illustrating optimization of preferred configurations in relationships between different points on the subject device;

DETAILED DESCRIPTION OF THE INVENTION

Figure 2:
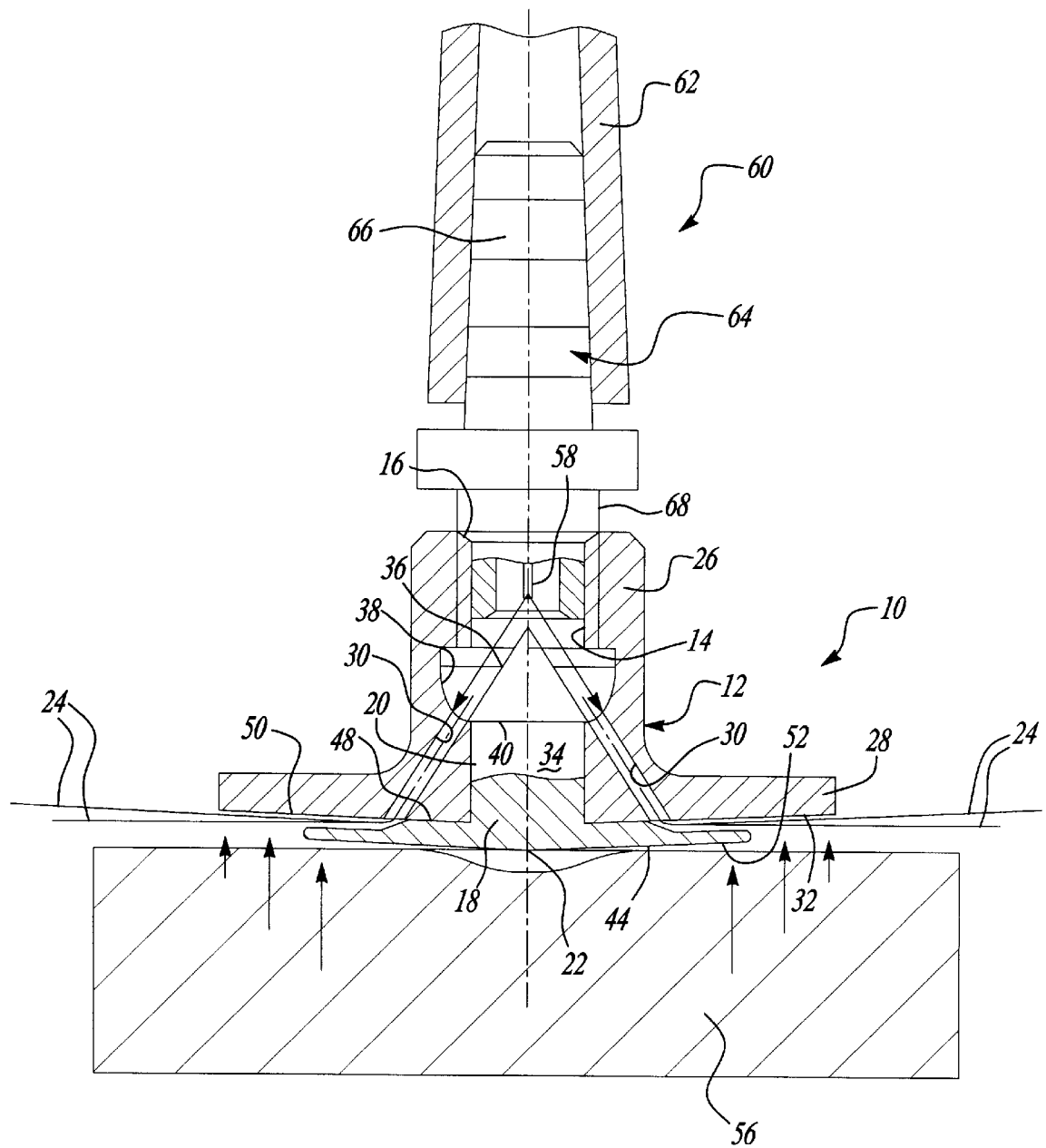
FIG. 2 is a cross-sectional view of the present invention as shown in use lifting an object, shown in cross section.

A device for shaping a vacuum made in accordance with the present invention is generally shown at 10 in the figures. Generally, the device 10 includes a housing generally shown at 12 having a primary passageway 14 extending therethrough. The passageway 14 includes an inlet end 16 and a second end 18. A fluid-shaping mechanism generally shown at 20 is disposed within the primary passageway 14 in fluid communication within the inlet 16 for changing the shape of a fluid flow into a planar fluid flow flowing radially outwardly from a central point 22 and creating a vacuum adjacent thereto. That is, disposed within the passageway is a mechanism which changes the shape of a cylindrical fluid flow flowing in through the inlet 16 into the primary passageway 14 which cooperates with the housing 12 to transform the shape of the fluid flow into a radially outwardly flowing planar flow, indicated by arrows 24 in FIG. 2. The flow is substantially radially outwardly extending with minimal turblence due to the shape of component parts and their geometric relationship, as described below.

The device 10 further includes a reflector mechanism disposed on the central point 22 within the planar fluid flow 24. Thus, the present invention provides a minimum point of contact between the surfaces in the area of the vacuum formation to increase accuracy when establishing a line of demarcation between local areas of the vacuum creation. The gripped object is gripped in a vacuum formed from the fluid flow spaced from the device. Likewise, the fluid shaping mechanism of the present invention increases efficiency, uniformity, and vacuum depth with a minimum of power consumption. Also, the present general configuration allows the use of liquid media, as well as gas media, as an energy carrier.

The use of a liquid media, as well as a gas media is a critical advantage of the present invention. The use of a liquid media allows the present invention to be utilized for various uses, such as coating. For example, the present invention can be utilized to coat an object, even having openings therethrough by passing the object over a device made in accordance with the present invention. The coating is then disposed over the device from the side opposite to the vacuum creating device. Preferably, the fluid used in the vacuum creating device of the present invention is a liquid which is the same as the material to be used to coat the object. The use of liquid in the present invention avoids the formation of droplets and the like becoming part of the coating while providing a homogeneous environment about the object being coated. Since the liquid coating material creates the vacuum within the present invention, the homogeneous environment about the object being coated is created. The vacuum created will draw coating into the openings in the object being coated. Thusly, any type of shaped opening within the object is coated.

Figure 6:
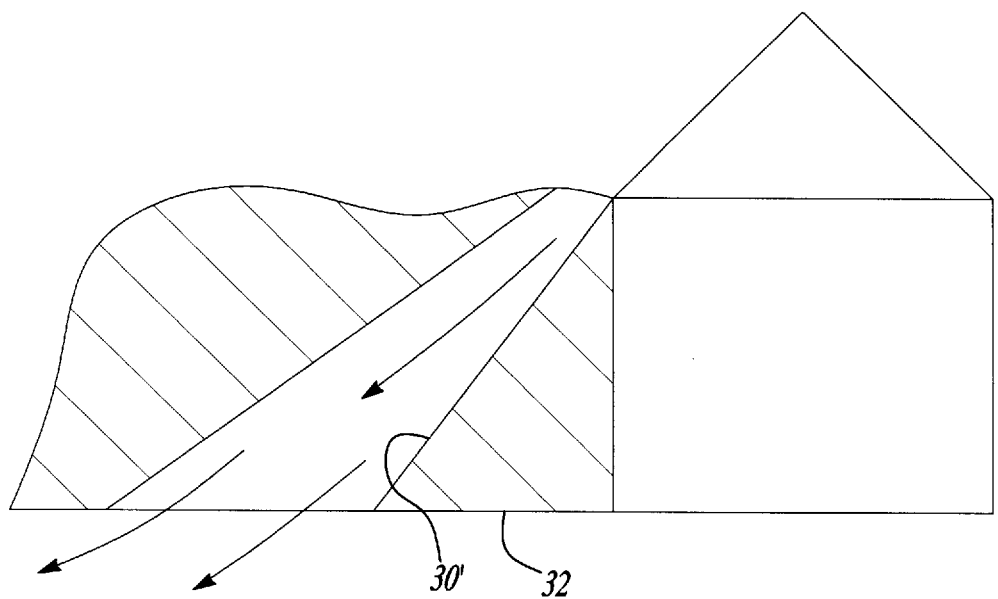
FIG. 6 is a fragmentary cross-sectional view of an alternative embodiment of a secondary passageway.

More particularly, the housing 12 includes a substantially tubular portion 26 including a substantially annular flange 28 extending from the second end 18 thereof. The housing 12 further includes a plurality of secondary passageways 30 uniformly spaced and extending from the passageway 14 to a bottom surface 32 on the other side of flange 28. As shown in FIG. 6, the passageway 30' can expand in cross-sectional diameter as it extends distally towards the bottom surface of the housing 12. The distal expansion of the secondary passageways leads to more uniform distribution of fluid flow as discussed below.

The fluid-shaping mechanism includes a pin-type portion 34 fixedly disposed in the second end 18 of the passageway 14. The pin-type portion 34 includes a conical head 36 disposed within a spherical cavity portion 38 of the passageway 14. The base 40 of the conical portion 36 is disposed at the sectional plane at the bottom of the spherical portion 38. The secondary passageways 30 have their axis 42 located along lines generated by the cone shape of conical portion 36.

The reflector mechanism includes a disk portion 44, which is shown to be integral with the pin portion 34. That is, a single member generally shown at 46 includes at its base the disk portion 44 and further includes the pin-type portion 34 extending from the center thereof. The single member 46 can include the pin-type portion 34 disposed within the second end 18 of the passageway 14 and connected thereto by various means known in the art. Such means can include glue, welding, force fit, or the like. A member 46 is disposed within the passageway 14 such that the conical head 36 is surface aligned with the bottom plane of the spherical portion 38 and also co-aligned with the bottom-most portion of the holes defining the openings into the secondary passageways 30.

The disk portion 44 includes a complex inner shape having a shoulder portion 48 in contact with the bottom surface 32 of the flange portion 28. There is also a recessed reflector portion 50 disposed radially outwardly from the shoulder portion 48, the reflector portion 50 being spaced from the working surface 32 of the flange portion 28. The reflector portion 50 is shaped so as to finally shape the fluid into the radially outwardly extending flow with minimal turbulence. The curved surface thereof adjacent the outlets of the secondary passageways 30 deflects the fluid flow with minimum agitation of the flow, directing it radially outwardly. Likewise, the outlets of secondary passageways 30' more evenly distribute the fluid flow over the torus surface of the reflector.

Figure 5:
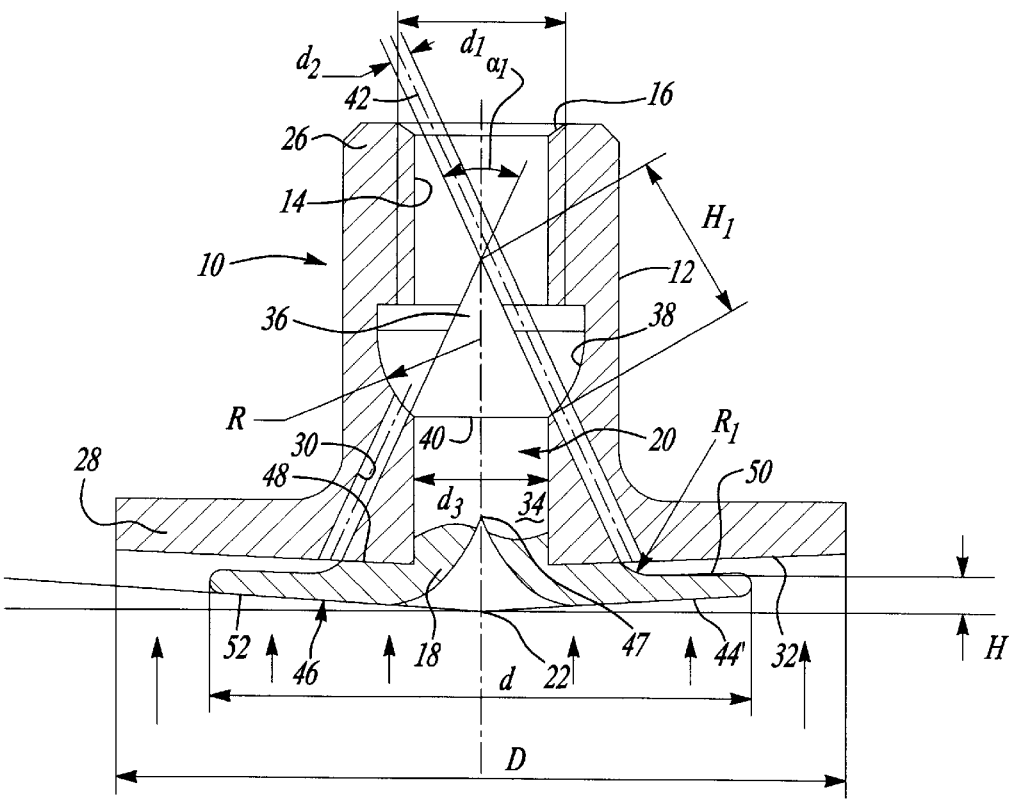
FIG. 5 is a cross-sectional view of a second embodiment of the present invention.

The disk portion 44 includes an external surface 52 having the conical shape whose apex angle, shown as D in FIG. 1, is preferably no less than 179°. Alternative embodiment of the disk portion 44' is shown in FIG. 5. The disk portion 44' includes a concave central portion 45 including apex 47. This configuration has also been shown to provide excellent vacuum creating effect.

Figure 4:
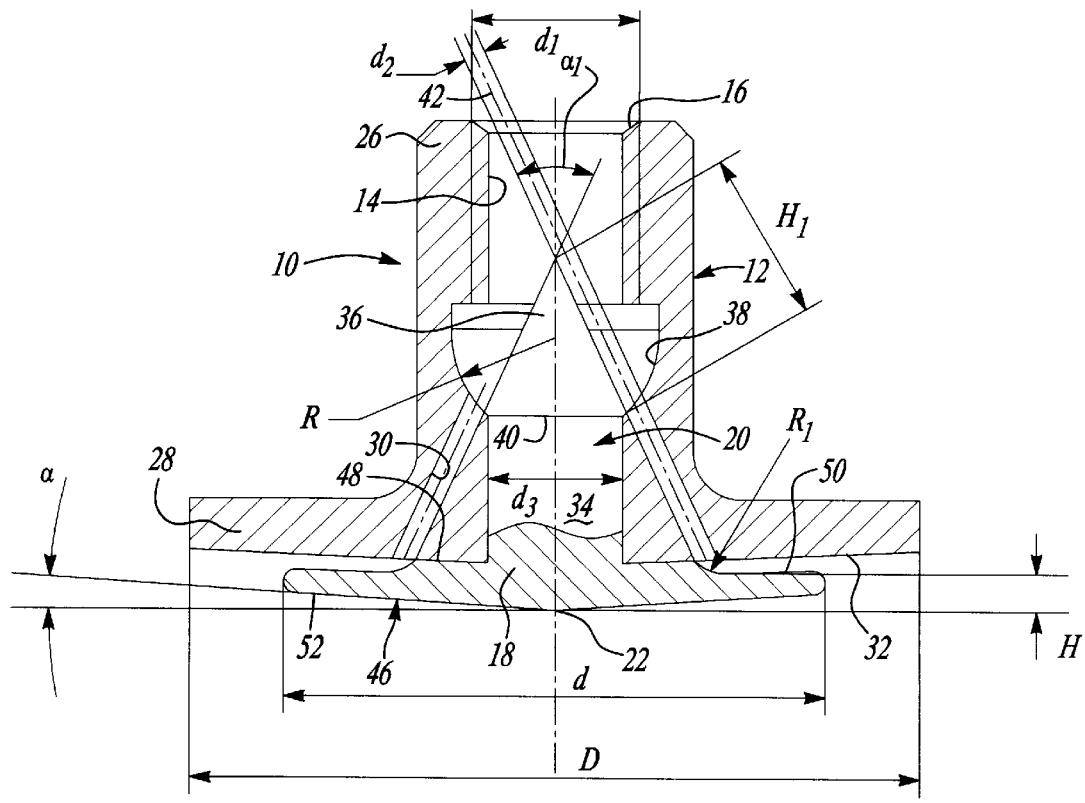
FIG. 4 is a cross-sectional view of the present invention showing further relationships and configurations between different points on the device.

Mathematical relationships have been calculated to maximize the preferred configurations and relationships between different geometric aspects of the present invention. To illustrate the relationships, the diameter of secondary passageways 30 are designated as $d_2$. The torus-shaped reflector 50 formed on the internal surface of the disk 40 has a diameter indicated as b. The diameter of the bottom surface 32 of the flange 28 is indicated as D on FIG. 4.

On FIG. 3, the diameter of the inlet 16, which can be a threaded hole, is indicated at $d_2$. The diameter of the cone basis of the conical reflector 50 is indicated at $d_3$. $d_4$ indicates the diameter of the periphery on which the centers of secondary passageways 30 are located. $d_5$ is the diameter of the periphery on which the centers of the secondary passageways on the bottom surface 32 are located. $H_3$ is the distance from the bottom surface 32 to the apex 22 of the external surface 56 of the disk 46. $H_4$ indicates the thickness of the disk 46. On FIG. 4, $\alpha_1$ is a designation of the conical reflector 50 apex angle and the angle is equal to it between the axis 42 of secondary passageways 30 and the flat fluid flow indicated at 24 in FIG. 3. $R_1$ is the radius of the torus surface of the reflector 50.

The optimized total area of the cross sections of the secondary passageways is equal to or more than the cross-sectional area of the housing inlet 16. The optimized diameter d of the disk 46 is related to the diameter D of the bottom surface 32 by the formula: D=d+(2÷31) mm. The length of the generating line of the rod conical recess (the conical reflector 50) is equal to the diameter $d_3$ of the pin-type portion 34. The optimized disk thickness after the toroidal reflector ($H_4$) is equal to the distance from the bottom surface 32 of the housing 12 to the internal surface of the disk ($H_2$). The optimum disk thickness after the toroidal reflector 50 is equal to a minimum of 0.1 mm and cannot be more than 0.5 mm. Further, the generating lines of the cylindrically disposed secondary passageways 30 are located on the tangent to the toroidal surface of the cone portion 36.

A further critical relationship is that the radius R of the spherical cavity 38 is connected with the diameter $d_3$ of the pin-type portion 34, the diameter $d_2$ of the secondary passageways 30 having the following geometric relationship:

$$R = \frac{d_3 + 2d_2 + 5 \text{ mm}}{2}$$

Further, the radius $R_1$ of the reflector 50 is equal to the distance between the apexes of the cone on the external surface of the disk 52 and the bottom surface 32 of the housing 12.

Based on the above relationships, fluid flow and time parameters are maximized. That is, there is minimum loss of energy between the shaping function of the present invention as well as efficiency in on/off times (vacuum on/vacuum off) of the invention.

FIG. 2 shows the present invention connected to a fluid source generally indicated at 60. The fluid source can include a hose or the like 62 connected to a connector piece 64. The connector piece can include a first end 66 force fit into the end of the tube 62 and a second threaded end 68 and threaded engagement with the threaded inlet end 16 of the housing 12. The fluid source can be in the form of compressed gas or liquid. Steam, pressurized gasses, such as oxygen, nitrogen, or other inert gasses can be used. Likewise, various liquids can be used including various coating and plating materials such as electrolytes, etching compounds, and the like. Hence, the present invention can be used to draw etching fluids over printed circuit boards while using the etching compound as the fluid within the subject device.

In operation, a robotic arm or the like including one or more of the grippers 10 of the present invention is brought to the surface of an object 56 to be gripped or to a zone where local vacuum is to be created. A fluid flow, sometimes termed "the working body" is delivered to the inlet 16 of the housing. A cylindrical fluid flow is delivered into the passageway 14 and is transformed into a conical fluid flow as the fluid flow flows over the conical portion 36. The conical portion 36 acts as a reflector on the conical fluid flow to transform the fluid flow into a conical shape. The conically-shaped fluid flow is transformed into a conical shell which hits and is shaped over the spherical portion 38 of the passageway 14 without losing energy from resistance and is directed to secondary passageways 30 without changing direction and without losing kinetic energy along the tangential line to the tangential reflector portion 50. The flow becomes straightened into a radially directed flat or linear flow which moves from the center to create a vacuum based on Bernoulli's law in combination with the external face of the disk 46.

A conical shape of the external surface 52 of the disk 46 presents the bottom surface contact between the surfaces of the vacuum formation zone to a minimum, increasing the accuracy in the demarcation of the local zones when creating the vacuum as well as increasing efficiency, uniformity, and depth of vacuum with minimum power consumption. Also, the present invention allows for the possibility of using a liquid as a working body, the working body being directed to the zone of shaping vacuum under pressure. Prior to arriving to the zone of the vacuum shaping, the flow of the working body is transformed from a cylindrical into a conical shell which is uniformly distributed over the zone of vacuum shaping into the flat flow radially directed from the conical shell axis and perpendicular to it. The shape and size of the flow is limited by the shape and size of the vacuum shaping zone As is described above, these relationships are optimized by optimizing the relationship between the height of the disk, the distance between the housing 12 and the disk 46, as well as between the diameters of the housing 12 and the disk 46.

By utilizing the present invention in combination with the efficiency of the present invention, the present invention can be used for gripping a dramatic variety of objects. For example, the present invention can be utilized for picking up a small diamond, as well as picking up a large treated object which must be transferred and disposed in caustic fluids. The present invention can be utilized to grip delicate items, such as tissue or printed circuit boards or the like without deforming the shape of the object being gripped. The present invention can also be used to grip complex-shaped objects, such as grooved board, boards having holes therethrough or the like. Hence, the present invention provides great flexibility in the type of objects to be gripped and provides various functions not obtainable by other gripping devices to be used in combination with processes such as etching processes, coating processes, plating processes, and the like. The present invention can be made from various materials, such as metal and ceramics, to allow the present invention to be utilized in harsh environments, such as acidic or high temperature environments.

For example, in one tested version of the present invention, the working body utilized is a gas. The gas can be pressurized to 2.5 kg/cm2. A consumption has been shown to be three liters per minute wherein the diameter of the working face 32 is 40 mm. The working capacity of the device was found to be 1.2 kg. The material used for making the housing is aluminum, the disk being made from stainless steel.

The second version of the second invention, the working body utilized, is a liquid. Specifically, the liquid consists of sulfuric acid and copper electrolyte ($CuSO_4$). The concentration is 2 g per meter. The temperature of the liquid is 30° C. The liquid is pressurized at 1.5 kg/cm2. The consumption of the working body is 0.5 $m^3$/hour. The housing and disk were made from propylene, the housing being polypropylene and the disk being reinforced polypropylene. The gripper made in accordance with this version was used for a electrolyte seepage by way of suction through the holes in printed circuit cards.

A third version of the present invention utilized an inert gas as the working body. The metal elements having a temperature of 125° C. and above were gripped. The subject device was made from temperature resistant ceramic composite.

In view of the above versions made in accordance to the present invention, it is demonstrated that the present invention can be utilized with various working bodies of liquid or gas used to grip various objects acquiring a significant force. The device can be made out of various materials so as to be able to handle objects of very high temperature or disposed in caustic environments.

The invention has been described in an illustrative manner, and it is to be understood the terminology used is intended to be in the nature of the description rather than of limitation.

What is claimed is:

1. A device for shaping a vacuum comprising:
    a housing including a primary passageway having an inlet; and
    fluid shaping means disposed in said passageways in fluid communication with said inlet for changing the shape of a fluid flow into a planar fluid flow flowing radially outwardly from a central point, said fluid shaping means including a conially shaped portion disposed within said passageway, a plurality of secondary passageways extruding through said housing from a periphery of said cone shaped surface to outlet at a bottom surface of said housing, and reflector means adjacent to and spaced from said secondary passageways radially outwardly to create a vacuum adjacent thereto.

2. A device as set forth in claim 1 wherein said passageway includes a plurality of secondary passageways are angled relative to said passageway along lines continuous with a surface of said conically-shaped portion for carrying the conical flow generated by said cone portion therethrough.

3. A device as set forth in claim 2 wherein said secondary passages increase in cross sectional diameter as said secondary passageways extend distally from said primary passageway.

4. A device as set forth in claim 1 wherein said primary passageway includes a substantially spherical surface directly adjacent said secondary passageways for shaping the conical flow into said secondary passageways.

5. A device as set forth in claim 4 wherein said reflector means includes a reflector surface opposite said bottom surface and a substantially conical opposite surface having an apex disposed on said central point within said planar fluid flow.

6. A device as set forth in claim 4 wherein said reflector means includes a reflector surface opposite said bottom surface and a substantially convex opposite surface having an apex disposed on said central point within planar fluid flow.

7. A device as set forth in claim 6 wherein said reflector means includes a disk having a torus shaped reflector opposite said bottom surface and spaced therefrom, said reflector having a torus shaped surface.

8. A device as set forth in claim 7 wherein said primary passageway includes a first end defining said inlet and a second end, and a plurality of said secondary passageways extending from said primary passageway to said bottom surface of said housing adjacent said second end of said passageway, said disk including a stem portion extending therefrom, said stem portion being fixedly disposed in said second end of said passageway, said stem portion including said conical portion at an end thereof most distal from said disk, said torus shaped reflector being spaced from said bottom surface and extending radially outwardly beyond outlet ends of said secondary passageway.

9. A device as set forth in claim 8 wherein said conical surface of said disk includes an apex angle, said bottom surface being frusto-conical and including a apex angle equal to said apex angle of said conical surface.

10. A device as set forth in claim 9 wherein said apex angle of said conical surface is 179° or greater.

11. A device as set forth in claim 4 or 8 wherein the total area of cross-sections of said secondary passageways is equal to or greater than the cross-section area of said inlet.

12. A device as set forth in claim 7 or 8 wherein said disk has a diameter d and said bottom surface has a diameter D, said diameters being related by the formula: D=d+(2÷31) mm.

13. A device as set forth in claim 8 wherein the length of generating line of said conical reflector is equal to the diameter of said stem portion.

14. A device as set forth in claim 8 wherein the disk thickness of said torus surface is equal to a distance from an edge of said bottom surface to an internal surface of said disk.

15. A device as set forth in claim 8 wherein said disk has a thickness after said torus surface of between 0.1 mm and 0.5 mm.

16. A device as set forth in claim 8 wherein generating lines of said secondary passageways are disposed on a tangent to said torus surface.

17. A device as set forth in claims 5 or 8 wherein said spherical surface has a radius R which is related to a diameter $d_3$ of said stem portion and diameter $d_2$ of said secondary passageways by a formula:

$$R = \frac{d_3 + 2d_2 + 5 \text{ mm}}{2}$$

18. A device as set forth in claim 8 wherein said torus surface has a radius R, which is equal to a distance between said apexes of said conical surface and said bottom surface.

19. A device for shaping a vacuum comprising:
a hollow housing including a passageway extending therethrough, said passageway including an inlet end and a second end and a plurality of passageways extending from said passageway to a working surface of said housing adjacent to said second end of said passageway; and
a disk including a stem portion extending therefrom, said stem portion being fixedly disposed in said second end of said passageway, said stem portion including a conical portion at an end thereof most distal from said disk, said disk having a surface adjacent to and spaced from said working surface.

20. A method of creating a local vacuum by changing the shape of a fluid flow by:
supplying a fluid flow into an inlet of a housing;
shaping the fluid flow into a conical fluid flow over a cone shaped portion;
collecting the conical fluid flow into a plurality of passageways; and
distributing the fluid flow from the passageways over a reflector which forms a radially outwardly planar fluid flow.

21. A method a set forth in claim 20 wherein the fluid is a liquid.

22. A method as set forth in claim 20 wherein the fluid is a gas.

23. A method as set forth in claim 20 including a first step of applying a fluid to a passageway under pressure prior to changing the shape of the formed fluid flow within the passageway.

24. A method as set forth in claim 23 using a compressed gas under at least 2 bars of pressure.

25. A method as set forth in claim 20 wherein the planar fluid flow has a thickness of not greater than 0.5 mm.

26. A method of coating an object by: passing an object over a device including a housing including a primary passageway having an inlet; and fluid shaping means disposed in said passageways in fluid communication with said inlet for changing the shape of a fluid flow into a planar fluid flow flowing radially outwardly from a central point, said fluid shaping means including a conically shaped portion disposed within said passageway, a plurality of secondary passageways extruding through said housing from a periphery of said cone shaped surface to outlet at a bottom surface of said housing, and reflector means adjacent to and spaced from said secondary passageways radially outwardly to create a vacuum adjacent thereto and applying a coating of fluid to the object from the side of the object opposite to said device.

27. A method as set forth in claim 26 wherein a fluid flowing through said device is the same fluid as the fluid coating the device.

28. A method as set forth in claim 27 wherein both fluids are liquids.

* * * * *